(12) United States Patent
Yoshikawa

(10) Patent No.: US 9,035,783 B2
(45) Date of Patent: May 19, 2015

(54) INPUT/OUTPUT VISUALIZATION PANEL

(71) Applicant: Yoshinari Yoshikawa, Los Altos, CA (US)

(72) Inventor: Yoshinari Yoshikawa, Los Altos, CA (US)

(73) Assignee: Miselu, Inc., San Francisco, CA (US)

( * ) Notice: Subject to any disclaimer, the term of this patent is extended or adjusted under 35 U.S.C. 154(b) by 156 days.

(21) Appl. No.: 13/756,373

(22) Filed: Jan. 31, 2013

(65) Prior Publication Data
US 2013/0234857 A1    Sep. 12, 2013

Related U.S. Application Data

(60) Provisional application No. 61/609,196, filed on Mar. 9, 2012.

(51) Int. Cl.
| | |
|---|---|
| G08B 21/00 | (2006.01) |
| G10H 7/00 | (2006.01) |
| G01R 31/04 | (2006.01) |
| G10H 1/00 | (2006.01) |

(52) U.S. Cl.
CPC .............. G10H 7/00 (2013.01); G01R 31/04 (2013.01); G10H 1/0008 (2013.01)

(58) Field of Classification Search
CPC ..... G10H 7/00; G10H 1/0008; G10H 1/0058; G10H 1/46; G10H 2210/281; G10H 2240/175; G10H 2240/211; G01R 31/04; H04H 60/04
USPC ............... 340/652, 815.4, 815.45, 815.56, 340/815.65; 84/742, 634, 644; 38/103, 119; 381/103, 119; 345/636
See application file for complete search history.

(56) References Cited

U.S. PATENT DOCUMENTS

| | | | |
|---|---|---|---|
| 6,782,108 B2* | 8/2004 | Shibata ......................... | 381/119 |
| 2002/0025051 A1* | 2/2002 | Kohno et al. ................. | 381/119 |
| 2007/0264862 A1* | 11/2007 | Hallberg ...................... | 439/489 |
| 2008/0080720 A1* | 4/2008 | Jacob et al. .................... | 381/103 |
| 2009/0282967 A1* | 11/2009 | Skillings ........................ | 84/742 |

OTHER PUBLICATIONS

Bell, Killian; http://www.macsessed.com/posts/visible-green-usb-cables-from-dexim-visuala-your-charging . . . Feb. 1, 2012; Visible Green USB Cables From Dexim Visualize Your Charging; 2 pages.
"ION, Piano 2 Go, Portable Musical Keyboard for iPod, iPhone and iPad"; Ionaudio.com; 1 page.

* cited by examiner

*Primary Examiner* — Anh V La
(74) *Attorney, Agent, or Firm* — Trellis IP Law Group, PC

(57) ABSTRACT

Embodiments of the invention provide information regarding device identity and connectivity among a system of music instruments or other electronic devices. Icons are displayed on a display screen. Each icon corresponds to a connector and can show a signal condition, status, state or other property of the associated connector, or of a device coupled to the connector.

10 Claims, 4 Drawing Sheets

INPUT/OUTPUT VISUALIZATION PANEL

CROSS REFERENCES TO RELATED APPLICATIONS

This application claims priority from U.S. Provisional Patent Application Ser. No. 61/609,196, entitled "Portable Piano Keyboard Computer", filed on Mar. 9, 2012, which is hereby incorporated by reference as if set forth in full in this application for all purposes.

BACKGROUND

Today's electronic musical devices are often provided with many ways to interconnect to other devices. Simpler devices such as instruments may only have a single signal output such as an electric guitar which uses a standard ¼ inch plug connector to provide an analog musical signal generated by the guitar. Other advanced electric guitars or other instruments may provide additional types of signals having associated connectors such as Musical Instrument Digital Interface (MIDI), Universal Synchronous Bus (USB), XLR connector by Canon, Deutsches Institut für Normung (DIN) connector, etc.

Each of these various signal and/or connector standards has its own properties and each may differ in its ability to convey information in both the type of information and amount. Generally, the signal/connector types are not compatible with each other, yet many signal/connector types may need to be accommodated in certain musical devices.

For example, a mixing board, electronic keyboard, electronic instrument, computer, analog to digital converter, music-adapted computing system, etc., all interconnected into a system, such as a recording system, may require dozens or even hundreds of connectors of several or many different types. Usually because of design constraints, many of the connectors are located along the sides or back of the enclosures of the musical devices. While such a layout is desirable to keep the many cables and wires out of the way of the control and display surfaces, the inability to easily view and obtain information about a connector's current status or operation can cause problems or inefficiencies for a user of the musical devices or system.

SUMMARY

Embodiments of the invention provide information regarding device identity and connectivity among a system of music instruments or other electronic devices. Icons are displayed on a display screen. Each icon corresponds to a connector and can show a signal condition, status, state or other property of the associated connector, or of a device coupled to the connector.

A particular embodiment provides an apparatus comprising: a housing for an electronic musical device; a plurality of connectors coupled to the housing; one or more processors; a display screen coupled to the one or more processors; a user input device coupled to the one or more processors; a sensor for sensing a connection condition of each of two or more of the plurality of connectors; instructions executed by the one or more processors for: displaying a representation of each of the two or more connectors on the display screen; and indicating the sensed connection condition for each of the two or more connectors.

Another embodiment provides a method for indicating a plurality of sensed conditions of a connector, the method including a digital processor to perform the following acts: accepting a signal from a sensor to provide the sensed conditions of the connector; and displaying an icon to indicate the sensed conditions of the connector.

Another embodiment provides a processor-readable tangible medium including instructions for indicating a plurality of sensed conditions of a connector, the processor-readable tangible medium including instructions for: accepting a signal from a sensor to provide the sensed conditions of the connector; and displaying an icon to indicate the sensed conditions of the connector.

A further understanding of the nature and the advantages of particular embodiments disclosed herein may be realized by reference to the specification and the attached drawings.

DETAILED DESCRIPTION OF EMBODIMENTS

Figure 1:
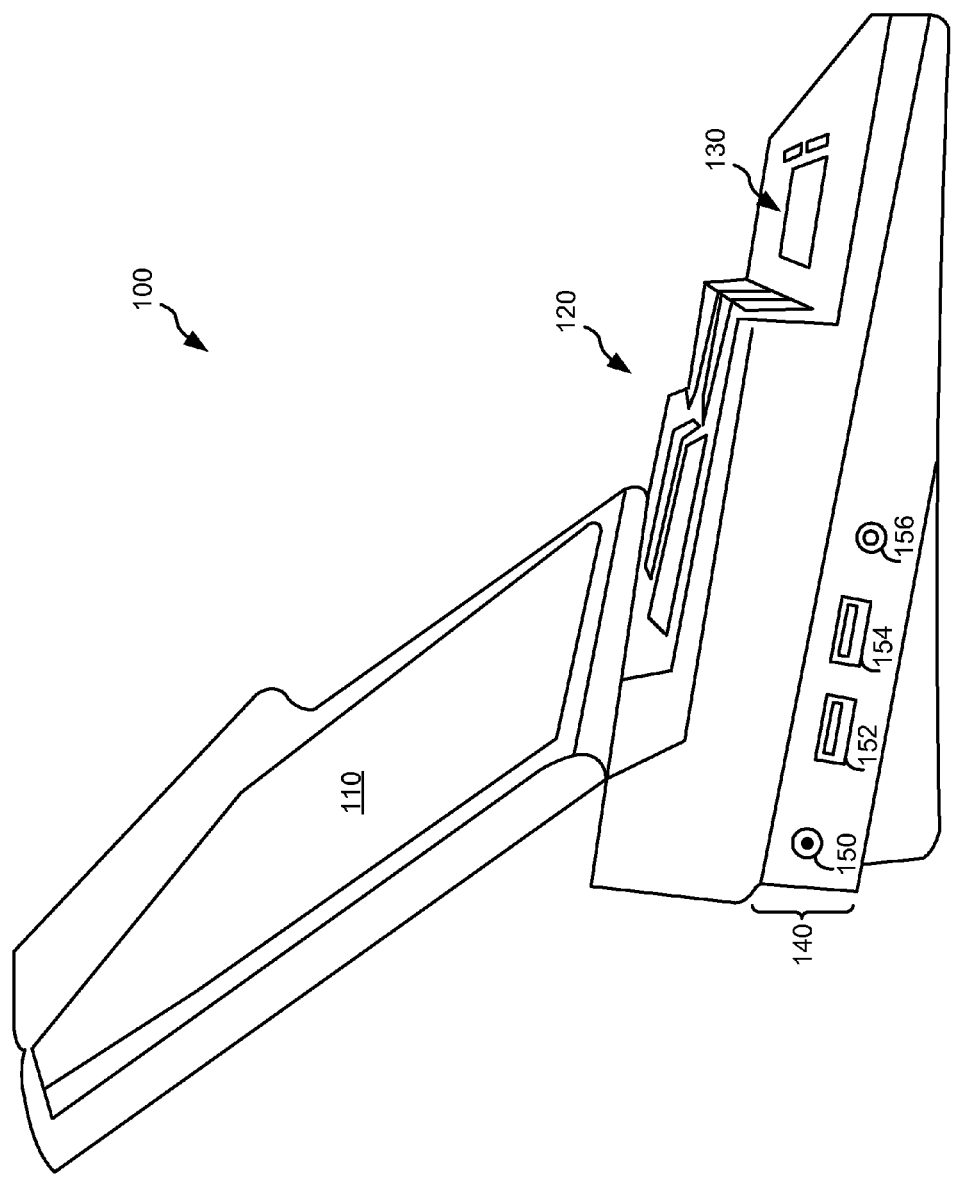
FIG. 1 illustrates an exemplary musical device that may be used with features described herein.

FIG. 1 illustrates an exemplary musical device such as that described generally in the provisional patent application referenced, above. In FIG. 1, portable piano keyboard 100 includes display screen 110 including touch sensors, piano keys 120, touchpad and associated buttons 130. Although specific user input/output controls are shown it should be apparent that many variations of musical devices are possible including other types of user input devices or controls such as an alphanumeric keyboard, mouse, trackpad; buttons, knobs, sliders and other discrete controls, etc. Other types of output are possible such as audio, discrete lights or indicators, etc. In general, a musical device can be any device that is used in a music application.

Connectors such as 150, 152, 154 and 156 are shown along the left side of the musical device at 140. Connectors are many and varied and can be of any type used in a musical device to send and/or receive signals to or from another musical device. For example, in FIG. 1, connector 150 is a socket to supply power to musical device 100. Typically, the plug for connector 150 would be a power adapter but in some cases the plug may originate from another musical device such as a mixing board, power management system, etc., that can be used to provide power to musical device 100. Connectors 152 and 154 are Universal Serial Bus (USB) connectors that can be used to connect instruments, peripherals or other musical devices. USB connectors provide a way to exchange high-speed digital signals among musical devices. Connector 156 is a standard audio output jack for outputting an analog signal to be heard by a user such as through headphones or speakers. In general, any type of plug, socket, jack or other means of connecting or coupling two devices together is included in the term "connector" including wireless means of communication such as Wi-Fi, Bluetooth, Ethernet, MIDI, etc.

Figure 2:
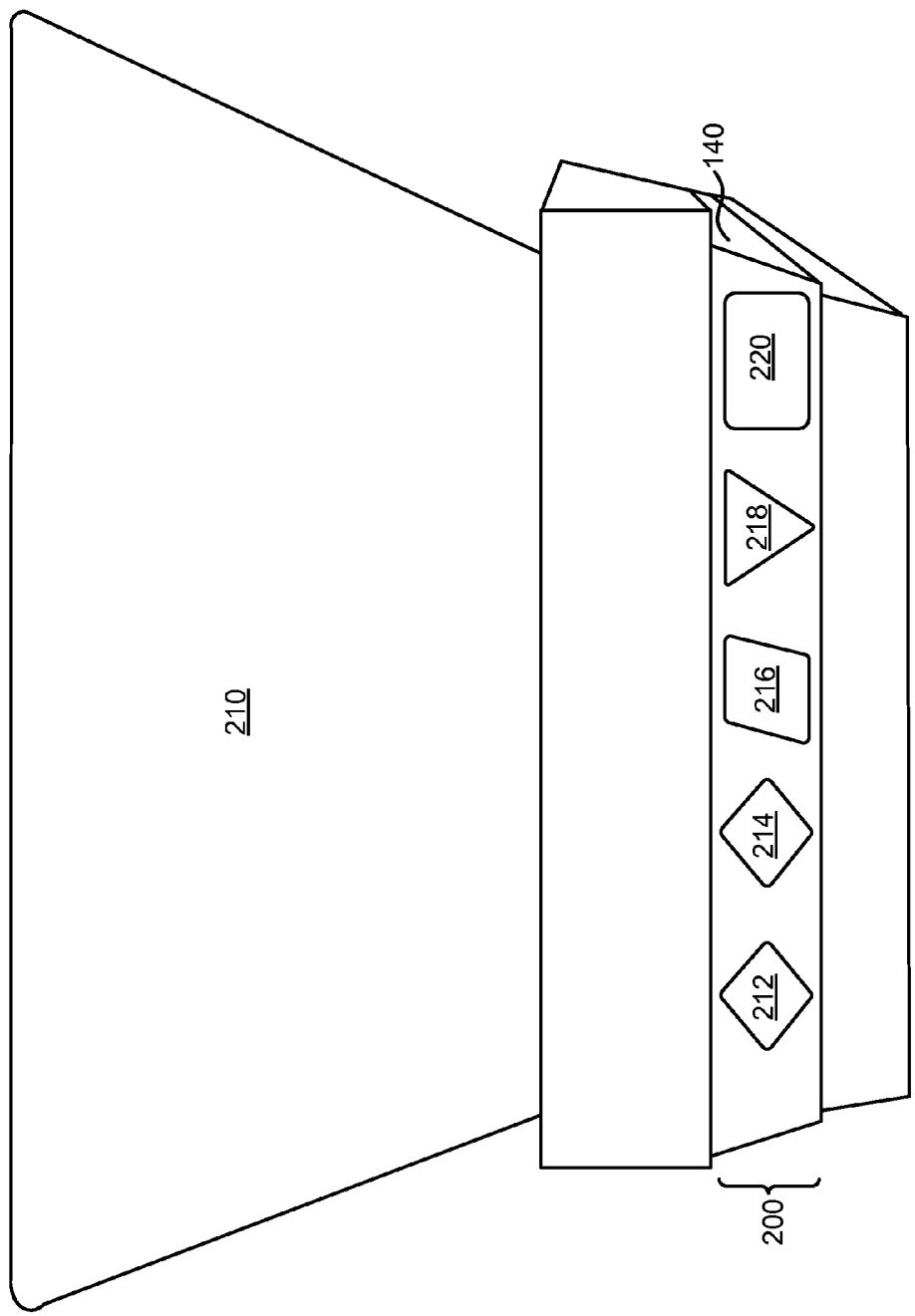
FIG. 2 shows a rear-view of the musical device of FIG. 1, including connectors.

FIG. 2 shows a rear-view of the musical device of FIG. 1. In FIG. 2, the back 210 of display screen 110 of FIG. 2 is shown overhanging connectors at 200 which are along the back of the musical device. Connectors 212-220 are symbolic depictions of any types of connectors, including, for example, those listed in Table I, below.

TABLE I

MIDI
USB
RF Connector
RCA connector
Audio Connector
Audio/Video Connector
HDMI (a/b/c)
Ethernet
Optical Audio
BNC Digital Audio
VGA
SCART
Display port
Fire wire
Thunderbolt
DVI
VIVO
Component
XLR
TOSLINK
DIN
TRS: microphone connector
Mullet-pin circular connectors
Modular connector
D-sub It should be apparent from FIGS. 1 and 2 that connectors such as at 140 and 200 can be difficult or impossible to view from a user's point of view during normal operation of the musical device. In cases such as the connectors along the rear of the musical device at 200 it is not even possible to see whether a cable has been attached to the connector. Often there are many cables that can be connected to other devices that may be too far away to see so that even if it is known that a cable is connected to a connector it is difficult or impossible to know visually the type of device that is connected and the types of signals being exchanged.

Figure 3:
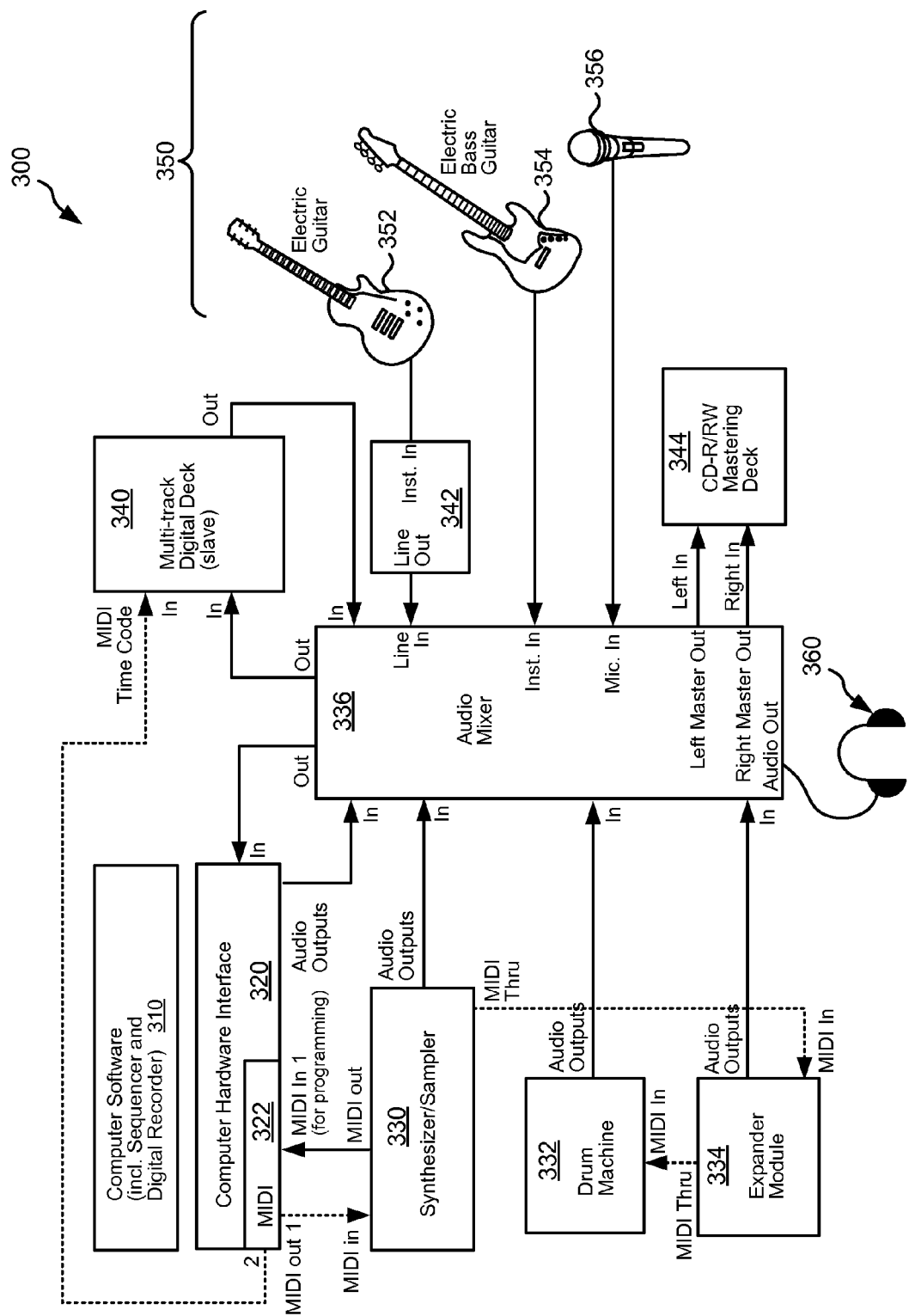
FIG. 3 shows an example arrangement of musical devices in a recording studio setup.

FIG. 3 shows an example arrangement of musical devices in a recording studio setup. In FIG. 3, recording system 300 includes many types of musical devices such as computer software 310 and computer hardware 320. Computer hardware 320 can include MIDI interface 322. Typically the computer software and hardware would be included in a single device such as a personal computer. Although discrete devices are shown having dedicated functionality, it is possible that the functionality can be spread or shared among multiple devices. For example, many musical devices may include a processor and other computing hardware and thus function as computer systems with some or all of their own local resources such as input/output devices, storage systems, software, etc. FIG. 3 is but one basic example of a system. The number and type of musical devices, connections and other properties of this example can vary.

Midi Interface 322 includes connections such as MIDI In/Out connections. For example, Synthesizer/Sampler 330 can be connected to computer hardware by MIDI Interface 322 or by other means. Drum machine 332 is controlled by an optional expander module 334 via synthesizer/sampler 330. Digital deck can be an external storage device such as a digital tape, solid state memory, etc. Many of the musical devices shown in FIG. 3 are connected to audio mixer 336. Note that the devices shown may be analog or digital or both even though they may be indicated as one or the other in the diagram.

Musical instruments such as guitar 352 and bass guitar 354 can be connected to other devices via a line adapter such as line adapter 342 or directly as in the case of bass guitar 354 which is directly connected to audio mixer 336. Microphone 356 is also connected to audio mixer 336 and the connection can be direct if the audio mixer is provided with a microphone connector, or indirect via additional musical devices such as a microphone amplifier, etc. Mastering deck 344 can receive audio or digital signals from audio mixer 336. Although some musical devices might be shown as only sending or only receiving signals, other types of such devices may provide two-way communications. For example, a standard electric guitar may just provide an analog instrument signal output. However, more advanced guitars such as a MIDI controller guitar, self-tuning guitar, etc., can provide additional output signals and can accept various input signals for controlling or sensing conditions or parameters in, on, or relating to the guitar or other instrument or device. Audio mixer 336 also provides an audio output to headphones 360.

As is known in the art, a recording studio or system may be configured in many different ways, with different types of cables and connectors (including wireless) to interconnect the various devices. For example, the musical device of FIG. 1 might be used for one or more of the functions performed by the computer software 310 and hardware 320 of FIG. 3. Or the musical device of FIG. 1 might be used as an input device such as an instrument or microphone at 350, or as synthesizer/sampler 330, etc. In any of these configurations and arrangements of devices it may be difficult to keep track of the many interconnections and to know what is going on in the system concerning the various musical devices.

Figure 4:
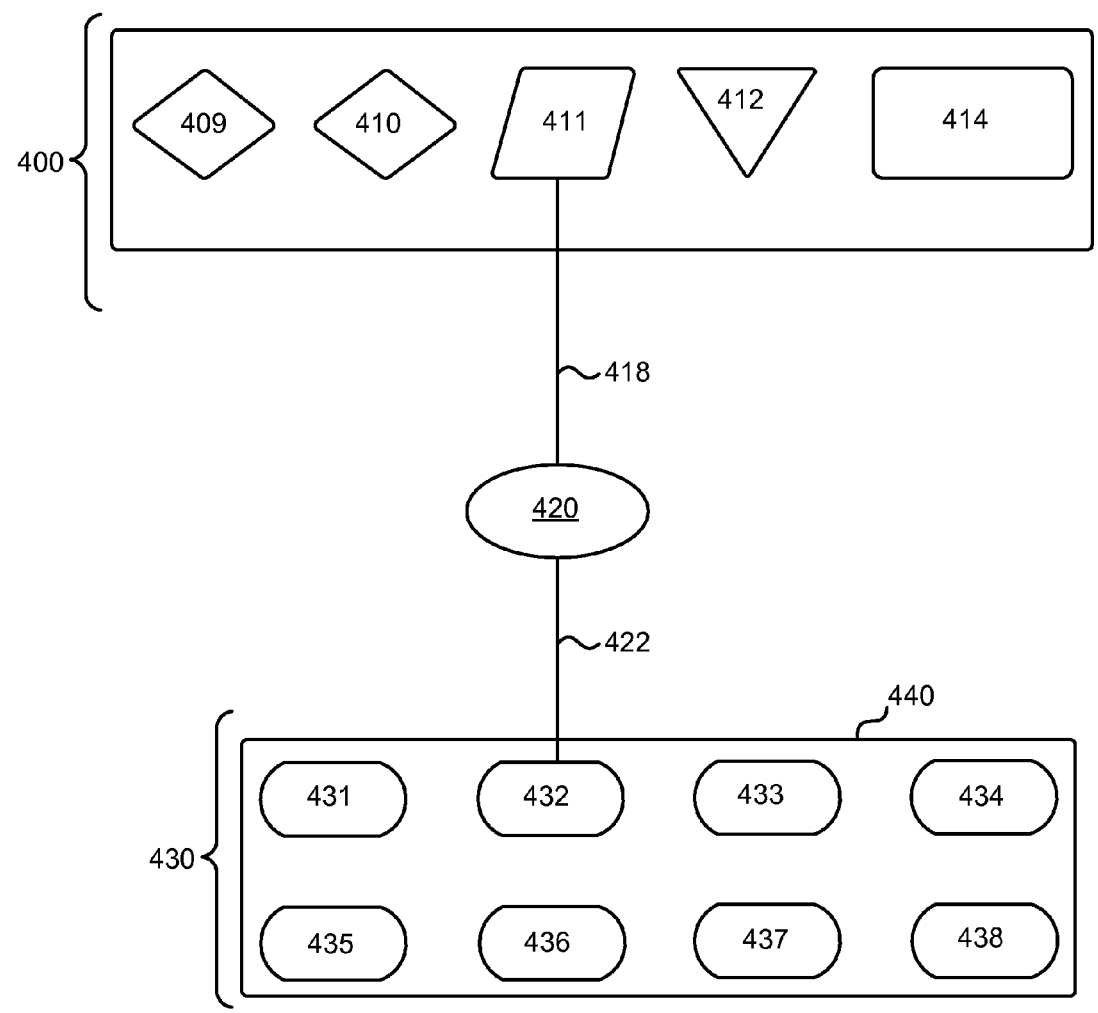
FIG. 4 shows basic components of an input/output visualizer.

FIG. 4 shows basic components of an input/output visualizer. In FIG. 4, connectors 409-414 at 400 represent physical connectors and/or signals 212-220 at 200 in the musical device shown in FIG. 2. Although the connectors are shown located together in a single device, it should be apparent that other embodiments can use connectors from any one or more different devices or objects in the system, such as the recording system of FIG. 3.

Sensor 420 acts to detect a condition of one or more wires, lines or signals associated with connector 411. Other sensors can also be used to detect conditions of one or more other connectors such as 409, 410, 412 and 414. Depending upon the sensor, one or more conditions may be measured or detected for one or more connectors by one or more sensors. Sensor 420 can include, for example, a simple latch or circuit to detect a binary condition, or sensor 420 can include more complex circuitry such as a processor, memory, control logic, etc., to act as a communications bridge between signals at connector 411 and display circuitry (not shown) to generate virtual display icon 432 corresponding to connector 411.

Virtual display icons at 430 include icons or other graphics that show the state or status of a corresponding connector or of wires or signals in the corresponding connector. Information obtained from sensor 420 is used to update icon 432 so that the state or status of one or more conditions of connector 411 is continuously displayed. Communication links such as 418 and 422 are used to convey information between connector 411 and sensor 420, and between sensor 420 and display circuitry to cause a display of icon 432 on display 440. Display circuitry (not shown) can include a processor, memory, stored instructions, dedicated logic, custom, semi-custom or discrete components or other hardware and software to implement the display and/or control functions. Display 440 can be, for example, screen 110 in FIG. 1. Control inputs for the control functions can be the input controls described in association with FIG. 1 such as piano keys 120, touchpad and associated buttons 130, etc. Note that any suitable type of display or controls can be used and the display device, controls, display circuitry or other components of the input visualizer system can reside in any one or more musical devices or other devices such as those shown in FIG. 3. Such displays, controls, devices or other components may include any suitable components that are presently known or that are developed in the future.

The type and amount of information that is indicated by the icons or other graphics can vary depending on the embodiment. For example, a basic type of icon may just show the type (symbolically) or name (in alphanumerics) of the connector and whether the connector is coupled to a device. Other icons may include additional information such as the type of other device that is coupled to the connector, the type of signals that are being sent through the connector, etc. Table II below lists some of the types of information that may be sensed and used to generate a visual indication of the information by using an icon or other graphic associated with a connector. As used in this document, "icon" includes any form of alphanumeric or graphical depiction of information relating to an associated connector's sensed signals.

============= BEGIN TABLE II ======================
- i. Is a device connected?
- ii. Is there a power draw?
- iii. Connection type (i.e. which type of connector is plugged in to that port)
- iv. Connection activity (is the connection active or not, binary)
- v. Connection failure (where a fault or error has occurred preventing effective connection)
- vi. Connected Device Manufacturer Identity
- vii. Connected Device Model Number
- viii. Connected Device Type
    1. If the device is a musical instrument
        a. Which form of instrument
    2. If device does not send information which can be used to trivially determine its identity
    3. A method of determining the type of instrument through:
        a. Sending one or more signal to the connected peripheral from the device by means of the connection
        b. Waiting a time step for a response
        c. Storing the response from the peripheral
        d. Decomposing/Analysing the signal from the peripheral and storing the result
        e. Examining a database of signals received from previous peripherals
            i. Making an estimate of the peripheral type based on a fuzzy match in the database
            ii. Making an estimate of the peripheral type based on a precise match in the database
            iii. Alerting the user as to the degree of confidence in the estimate of peripheral type
- ix. Measures of connection voltage
- x. What driver is activated
- xi. Upon check in with web service:
    1. Is driver the most recent?
    2. Is the driver correct for this hardware?
- xii. Identify wither the a transfer action is active
- xiii. Measures of connection transmission rate
    1. This measurement may be represented by an animation
    2 The rate of change of the animation is proportional to the rate of transmission
- xiv. Show differences between
    1. Isochronous transfers
    2 Interrupt transfers
    3. Bulk transfers
    4. Current or Max Transfer Speed
        a. Low, 1.5 Mbit/s or below
        b. Full, up to 12 Mbit/s
        c. High, up to 480 Mbit/s
        d. Super, up to 5000 Mbit/s

============= END TABLE II ======================

In the case where the connector is a modern intelligent connector type, such as USB (1.0, 1.1, 2.0, 3.0) then a connected device may have the ability to transmit information regarding its connection to the display circuitry. A connected device may have the ability to transmit to the display circuitry information regarding its identity (unique device serial number, device type/class, manufacturer information, other information).

The size, shape, amount of information, and other properties of the icons can vary. In one example, an icon may only display a small amount of alphanumeric information. In another example, the icon may be a graphically accurate or photorealistic image of its corresponding connector. Information about the connector can be shown with symbols, words, numbers, charts, animations, highlighting, etc. In general, the design of the icons can vary according to the application. Multiple different types of icons may be used in a set of icons.

Although the description has been described with respect to particular embodiments thereof, these particular embodiments are merely illustrative, and not restrictive.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a computer-readable storage medium for use by or in connection with the instruction execution system, apparatus, system, or device. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

A "processor" includes any suitable hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems. A computer may be any processor in communication with a memory. The memory may be any suitable processor-readable storage medium, such as random-access memory (RAM), read-only memory (ROM), magnetic or optical disk, or other tangible media suitable for storing instructions for execution by the processor.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

I claim:

1. An apparatus comprising:
   a housing for an electronic device;
   a plurality of connectors coupled to the housing, each connector being characterized by a corresponding connector type;
   one or more processors;
   a display screen coupled to the one or more processors;
   a user input device coupled to the one or more processors; and
   a sensor for sensing a sensed condition of each of two or more input signals, each input signal being associated with a corresponding one of each of two or more of the plurality of connectors; and
   a tangible storage medium including instructions executable by the one or more processors for:
   displaying a representation of each of the two or more connectors on the display screen;
   indicating the connector type of each of the two or more connectors; and
   indicating the sensed connection condition for each of the input signals associated with the two or more connectors.

2. The apparatus of claim 1, wherein the sensed connection condition includes whether a signal in the connection is active or inactive.

3. The apparatus of claim 1, wherein the representation of a connector is in a different color for different connectors.

4. The apparatus of claim 1, wherein the sensor additionally senses for each of the two or more connectors a second sensed condition, the second sensed condition being one of the following: (i) whether a device is connected to a connector, (ii) whether there is power being drawn from a connector, (iii) connection activity, (iv) connection failure, (v) connected device manufacturer identity, (vi) connected device model number, (vii) connected device type, (viii) associated driver, (ix) characteristic of the driver, (x) whether a transfer action is active, (xi) connection transmission rate, (xii) transfer type.

5. The apparatus of claim 1, wherein the electronic device is an electronic music device.

6. The apparatus of claim 1, wherein the sensor comprises communications circuitry allowing wireless communication between the electronic device and one other device.

7. A method for indicating a condition of a connector characterized by a connector type, and a sensed condition of an input signal associated with the connector, the method including a digital processor to perform the following acts:
   accepting a sensor signal from a sensor to provide the sensed condition of the input signal associated with the connector;
   displaying an icon to indicate the connector type; and
   displaying an icon to indicate the sensed condition of the input signal associated with the connector.

8. The method of claim 7, wherein the method further comprises using the digital processor to accept at least one sensor signal from the sensor to provide at least one of the following sensed conditions: (i) whether a device is connected to a connector, (ii) whether there is power being drawn from a connector, (iii) connection activity, (iv) connection failure, (v) connected device manufacturer identity, (vi) connected device model number, (vii) connected device type, (viii) associated driver, (ix) characteristic of the driver, (x) whether a transfer action is active, (xi) connection transmission rate, (xii) transfer type.

9. A processor-readable tangible medium including instructions for indicating a condition of a connector characterized by a connector type, and a sensed condition of an input signal associated with the connector, the processor-readable tangible medium including instructions for:
   accepting a sensor signal from a sensor to provide the sensed condition of the input signal associated with the connector;
   displaying an icon to indicate the connector type; and
   displaying an icon to indicate the sensed condition of the input signal associated with the connector.

10. The processor-readable tangible medium of claim 9, wherein the instructions further comprise accepting at least one sensor signal from the sensor to provide at least one of the following sensed conditions: (i) whether a device is connected to a connector, (ii) whether there is power being drawn from a connector, (iii) connection activity, (iv) connection failure, (v) connected device manufacturer identity, (vi) connected device model number, (vii) connected device type, (viii) associated driver, (ix) characteristic of the driver, (x) whether a transfer action is active, (xi) connection transmission rate, (xii) transfer type.

* * * * *